(12) United States Patent
Sato et al.

(10) Patent No.: US 11,820,105 B2
(45) Date of Patent: Nov. 21, 2023

(54) PREPREG, METAL-CLAD LAMINATE, AND WIRING BOARD

(71) Applicant: PANASONIC INTELLECTUAL PROPERTY MANAGEMENT CO., LTD., Osaka (JP)

(72) Inventors: Mikio Sato, Osaka (JP); Hiroaki Fujiwara, Nara (JP); Yuki Kitai, Osaka (JP); Masashi Koda, Osaka (JP); Yasunori Hoshino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/650,664

(22) PCT Filed: Sep. 28, 2018

(86) PCT No.: PCT/JP2018/036186
§ 371 (c)(1),
(2) Date: Mar. 25, 2020

(87) PCT Pub. No.: WO2019/065941
PCT Pub. Date: Apr. 4, 2019

(65) Prior Publication Data
US 2020/0247972 A1    Aug. 6, 2020

(30) Foreign Application Priority Data

Sep. 29, 2017 (JP) ............................... 2017-190782

(51) Int. Cl.
| C08J 5/24 | (2006.01) |
| C08K 3/36 | (2006.01) |
| C08K 9/06 | (2006.01) |
| H05K 1/03 | (2006.01) |
| B32B 5/02 | (2006.01) |
| B32B 15/14 | (2006.01) |

(52) U.S. Cl.
CPC ................ *B32B 15/14* (2013.01); *B32B 5/02* (2013.01); *C08J 5/244* (2021.05); *C08J 5/249* (2021.05); *C08K 3/36* (2013.01); *C08K 9/06* (2013.01); *H05K 1/0366* (2013.01); *H05K 1/0373* (2013.01); *B32B 2260/021* (2013.01); *B32B 2260/046* (2013.01); *B32B 2262/101* (2013.01); *B32B 2457/08* (2013.01); *C08J 2371/12* (2013.01)

(58) Field of Classification Search
CPC .......... C08J 5/24; C08J 2371/12; B32B 5/02; B32B 15/14; B32B 2260/021; B32B 2260/046; B32B 2262/101; B32B 2457/08; C08K 3/36; C08K 9/06; H05K 1/0366; H05K 1/0373
See application file for complete search history.

(56) References Cited

U.S. PATENT DOCUMENTS

| 8,227,361 | B2† | 7/2012 | Amou | |
| 2004/0146692 | A1 | 7/2004 | Inoue et al. | |
| 2005/0064159 | A1 | 3/2005 | Amou et al. | |
| 2007/0031671 | A1† | 2/2007 | Mizusaki | |
| 2007/0292668 | A1 | 12/2007 | Amou et al. | |
| 2008/0254257 | A1 | 10/2008 | Inoue et al. | |
| 2009/0266591 | A1 | 10/2009 | Amou et al. | |
| 2009/0266951 | A1 | 10/2009 | Amou et al. | |
| 2010/0218982 | A1* | 9/2010 | Fujiwara | C08K 5/3417 174/257 |
| 2014/0044918 | A1 | 2/2014 | Zeng | |
| 2015/0218326 | A1† | 8/2015 | Kitai | |
| 2016/0145370 | A1 | 5/2016 | Kitai et al. | |
| 2016/0168378 | A1 | 6/2016 | Umehara et al. | |
| 2016/0297988 | A1* | 10/2016 | Liu | C08J 5/244 |
| 2019/0300639 | A1 | 10/2019 | Kitai et al. | |

FOREIGN PATENT DOCUMENTS

| CN | 102807658 A | * 12/2012 | ............. B32B 27/04 |
| CN | 102807658 A | 12/2012 | |
| CN | 105358595 A | 2/2016 | |
| JP | 2005-089691 A | 4/2005 | |
| JP | 2006-516297 A | 6/2006 | |
| JP | 2009-263569 A | 11/2009 | |
| JP | 2010-111758 A | 5/2010 | |
| JP | 2012-246395 A | 12/2012 | |
| JP | 2015-078079 A | 4/2015 | |
| JP | 2016-113543 A | 6/2016 | |

OTHER PUBLICATIONS

Machine Translation of CN 102807658 A (Year: 2012).*
ISR issued in WIPO Patent Application No. PCT/JP2018/036186, dated Jan. 8, 2019, English translation.
Editors: Wallenberger, Frederick T., Bingham, Paul A. Title: Fiberglass and Glass Technology Page(s) being submitted: 5 Year of publication: 2010 Publisher: Springer US Hardcover ISBN: 978-1-4419-0735-6.†

* cited by examiner
† cited by third party

*Primary Examiner* — Callie E Shosho
*Assistant Examiner* — Bethany M Miller
(74) *Attorney, Agent, or Firm* — GREENBLUM & BERNSTEIN, P.L.C.

(57) ABSTRACT

One aspect of the present invention is a prepreg including a resin composition or a semi-cured product of the resin composition and a fibrous base material, in which the resin composition contains a modified polyphenylene ether compound terminally modified with a substituent having an unsaturated carbon-carbon double bond, and a crosslinkable curing agent having an unsaturated carbon-carbon double bond in a molecule, the fibrous base material is quartz glass cloth, the prepreg contains a silane coupling agent having an unsaturated carbon-carbon double bond in a molecule, in an amount of 0.01% by mass or more and less than 3% by mass with respect to the prepreg, and a cured product of the prepreg has a dielectric loss tangent of 0.002 or less at 10 GHz.

6 Claims, 3 Drawing Sheets

PREPREG, METAL-CLAD LAMINATE, AND WIRING BOARD

TECHNICAL FIELD

The present invention relates to a prepreg, a metal-clad laminate, and a wiring board.

BACKGROUND ART

In various electronic devices, with an increase in the information processing amount, mounting technologies such as higher integration of semiconductor devices to be mounted, higher wiring density, and multilayering are rapidly progressing. Substrate materials for constituting a base material of wiring boards used in various electronic devices are required to have low permittivity and dielectric loss tangent in order to increase signal transmission speed and reduce loss in signal transmission. Moreover, as a wiring board used for various electronic devices, it is required to be a wiring board corresponding to high frequency, such as a millimeter wave radar substrate in on-vehicle use, for example.

It is known that polyphenylene ethers have excellent low dielectric properties such as permittivity and dielectric loss tangent, and have excellent low dielectric properties such as permittivity and dielectric loss tangent even in high frequency bands from MHz band to GHz band (high frequency regions). Therefore, polyphenylene ethers are considered to be used as, for example, a molding material for high frequency applications. More specifically, it is preferably used as a substrate material for constituting a base material of a wiring board provided in an electronic device including a high frequency band or the like.

On the other hand, when used as a molding material such as a substrate material, it is required not only to have excellent low dielectric properties but also to have excellent heat resistance and the like. Based on this, it is considered that polyphenylene ether is modified to improve heat resistance.

Examples of such a substrate material include a prepreg and a laminate including a resin composition containing a modified polyphenylene ether, and the like. Patent Literature 1 describes a polyphenylene ether having a polyphenylene ether moiety in the molecular structure, and having an ethenylbenzyl group or the like at the molecular terminal, and having a number average molecular weight of 1000 to 7000, and a prepreg and a laminate including the polyphenylene ether resin composition containing a crosslinkable curing agent.

According to Patent Literature 1, it is disclosed that a laminate having high heat resistance, moldability and the like can be obtained without degrading dielectric properties. As described above, it is considered that when a material with reduced permittivity and dielectric loss tangent is used as a substrate material for producing an insulating layer provided in the wiring board, loss in signal transmission in the obtained wiring board can be reduced. The wiring board is required to have excellent heat resistance as described above, and to further reduce the loss in signal transmission in order to further increase the signal transmission speed. For these reasons, as the substrate material for producing an insulating layer provided in the wiring board, a material not only excellent in heat resistance but also excellent in low dielectric properties is required.

CITATION LIST

Patent Literature

Patent Literature 1: JP 2006-516297 A

SUMMARY OF INVENTION

The present invention has been made in view of the above circumstances, and an object of the present invention is to provide a prepreg, a metal-clad laminate, and a wiring board excellent in low dielectric properties and heat resistance.

One aspect of the present invention is a prepreg including a resin composition or a semi-cured product of the resin composition and a fibrous base material, in which the resin composition contains a modified polyphenylene ether compound terminally modified with a substituent having an unsaturated carbon-carbon double bond, and a crosslinkable curing agent having an unsaturated carbon-carbon double bond in a molecule, the fibrous base material is quartz glass cloth, the prepreg contains a silane coupling agent having an unsaturated carbon-carbon double bond in a molecule, in an amount of 0.01% by mass or more and less than 3% by mass with respect to the prepreg, and a cured product of the prepreg has a dielectric loss tangent of 0.002 or less at 10 GHz.

These and other objects, features and advantages of the present invention will be apparent from the following detailed description.

DESCRIPTION OF EMBODIMENTS

The present inventors have focused on the fact that, conventionally, in a prepreg, a fibrous base material constituting the prepreg had not been studied much while a composition of the resin composition constituting the prepreg had been studied, in order to enhance low dielectric properties of a cured product of the prepreg. The present inventors have examined the fibrous base material, and found that when a glass cloth with low silicon dioxide ($SiO_2$) content, for example, less than 60% by mass, is used as the fibrous base material, permittivity of the glass cloth is high, thus permittivities of a laminate and a wiring board obtained from the prepreg are also high. Therefore, the present inventors have focused on the fact that a quartz glass cloth having a relatively high content of $SiO_2$ has a relatively low permittivity, and using this quartz glass cloth as the fibrous base material, as a result of detailed studies of the resin composition and the structure of the prepreg and the like corresponding to the quartz glass cloth, it has been found that the above object can be achieved by the following present invention.

Hereinafter, the embodiment according to the present invention will be described, but the present invention is not limited thereto.

<Prepreg>

Figure 1:
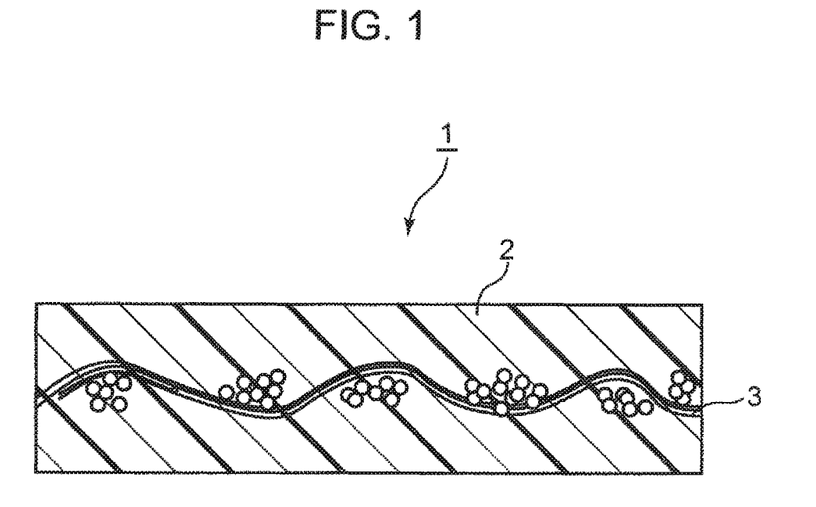
FIG. 1 is a schematic cross-sectional view showing an example of a prepreg according to an embodiment of the present invention.

The prepreg according to one embodiment of the present invention includes a resin composition or a semi-cured product of the resin composition, and a fibrous base material. As shown in FIG. 1, examples of a prepreg 1 include those including a resin composition or a semi-cured product 2 of the resin composition, and a fibrous base material 3 present in the resin composition or the semi-cured product 2 of the resin composition, and the like.

In the present embodiment, the semi-cured product is a product that has been cured halfway to such an extent that the resin composition can be further cured. That is, the semi-cured product is a semi-cured (B-staged) resin composition. For example, when the resin composition is heated, first, viscosity gradually decreases with melting, then curing starts, and viscosity gradually increases. In such a case, the semi-curing includes a state from a start of gradual viscosity decrease to complete curing, and the like.

The prepreg according to the present embodiment may include a semi-cured product of the resin composition as described above, or may include the uncured resin composition itself. That is, the prepreg according to the present embodiment may be a prepreg including the semi-cured product of the resin composition (the B-stage resin composition) and a fibrous base material, or may be a prepreg including the resin composition before curing (the A-stage resin composition) and a fibrous base material.

The resin composition in the prepreg according to the present embodiment contains a modified polyphenylene ether compound terminally modified with a substituent having an unsaturated carbon-carbon double bond, and a crosslinkable curing agent having an unsaturated carbon-carbon double bond in a molecule. Also, the semi-cured product in the prepreg is a semi-cured product of the resin composition. Moreover, the fibrous base material in the prepreg is quartz glass cloth. Further, the prepreg contains a silane coupling agent having an unsaturated carbon-carbon double bond in a molecule, in an amount of 0.01% by mass or more and less than 3% by mass with respect to the prepreg. Furthermore, a cured product of the prepreg has a dielectric loss tangent of 0.002 or less at 10 GHz.

The prepreg as described above is excellent in low dielectric properties and heat resistance. First, it is considered that a prepreg obtained by using a quartz glass cloth having a relatively low permittivity as the fibrous base material constituting the prepreg has excellent low dielectric properties of a cured product thereof. However, only by simply using quartz glass cloth as the fibrous base material, there have been cases where low dielectric properties of the cured product are not sufficiently high, or heat resistance of the cured product is not sufficiently high. Therefore, the prepreg not only uses quartz glass cloth as the fibrous base material, but also uses a resin composition containing the modified polyphenylene ether compound and the crosslinkable curing agent, as the resin composition constituting the prepreg. Also, the prepreg contains a predetermined amount of the silane coupling agent in the prepreg. Further, in the prepreg, a state of quartz glass cloth and the like are adjusted so that the dielectric loss tangent of the cured product of the prepreg is within the above range. Thus, a prepreg excellent in low dielectric properties and heat resistance can be obtained.

[Resin Composition]

The resin composition used in the present embodiment contains the modified polyphenylene ether compound and the crosslinkable curing agent.

(Modified Polyphenylene Ether Compound)

The modified polyphenylene ether compound is not particularly limited as long as it is a modified polyphenylene ether compound terminally modified with a substituent having an unsaturated carbon-carbon double bond. Examples of the modified polyphenylene ether compound include a modified polyphenylene ether compound having a polyphenylene ether chain in a molecule and terminally modified with a substituent having an unsaturated carbon-carbon double bond, and the like.

Specific examples of the modified polyphenylene ether compound include modified polyphenylene ether compounds represented by the following formula (I) or formula (2), and the like.

[Chemical Formula 1]

(1)

In the formula (1), m and n are preferably such that the total value of m and n is, for example, 1 to 30. Moreover, m is preferably 0 to 20, and n is preferably 0 to 20. That is, it is preferred that m represents 0 to 20, n represents 0 to 20, and the sum of m and n represents 1 to 30. In addition, Xs represent substituents having an unsaturated carbon-carbon double bond. Also, $R_1$ to $R_8$ are independent of each other. That is, $R_1$ to $R_8$ may be the same group or different groups. Further, $R_1$ to $R_8$ represent a hydrogen atom, an alkyl group, an alkenyl group, an alkynyl group, a formyl group, an alkylcarbonyl group, an alkenylcarbonyl group, or an alkynylcarbonyl group. Among them, $R_1$ to $R_8$ are preferably a hydrogen atom or an alkyl group.

Examples of the modified polyphenylene ether compounds represented by the formula (I) include a modified polyphenylene ether compound in which, among $R_1$ to $R_8$, $R_1$, $R_2$, $R_7$ and $R_8$ are methyl groups and the others are hydrogen atoms, a modified polyphenylene ether compound in which, among $R_1$ to $R_8$, $R_1$, $R_2$, $R_3$, $R_6$, $R_7$ and $R_8$ are methyl groups, and the others are hydrogen atoms, and the like.

Specific examples of the groups listed in $R_1$ to $R_8$ include the following.

The alkyl group is not particularly limited, but is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

The alkenyl group is not particularly limited, but is, for example, preferably an alkenyl group having 2 to 18 carbons, and more preferably an alkenyl group having 2 to 10 carbons. Specific examples thereof include a vinyl group, an allyl group, a 3-butenyl group, and the like.

The alkynyl group is not particularly limited, but is, for example, preferably an alkynyl group having 2 to 18 carbons, and more preferably an alkynyl group having 2 to 10 carbons. Specific examples thereof include an ethynyl group, a prop-2-yn-1-yl group (propargyl group), and the like.

The alkylcarbonyl group is not particularly limited as long as it is a carbonyl group substituted with an alkyl group, but is, for example, preferably an alkylcarbonyl group having 2 to 18 carbons, and more preferably an alkylcarbonyl group having 2 to 10 carbons. Specific examples thereof include an acetyl group, a propionyl group, a butyryl group, an isobutyryl group, a pivaloyl group, a hexanoyl group, an octanoyl group, a cyclohexylcarbonyl group, and the like.

The alkenylcarbonyl group is not particularly limited as long as it is a carbonyl group substituted with an alkenyl group, but is, for example, preferably an alkenylcarbonyl group having 3 to 18 carbons, and more preferably an alkenylcarbonyl group having 3 to 10 carbons. Specific examples thereof include an acryloyl group, a methacryloyl group, a crotonoyl group, and the like.

The alkynylcarbonyl group is not particularly limited as long as it is a carbonyl group substituted with an alkynyl group, but is, for example, preferably an alkynylcarbonyl group having 3 to 18 carbons, and more preferably an alkynylcarbonyl group having 3 to 10 carbons. Specific examples thereof include a propioloyl group and the like.

[Chemical Formula 2]

(2)

In the formula (2), m and n are the same as m and n in the formula (1). Also, in the formula (2), $R_9$ to $R_{16}$ are the same as $R_1$ to $R_8$ in the formula (1). In addition, Xs are the same as Xs in the formula (1). Further, Y represents a linear, branched, or cyclic hydrocarbon group. Furthermore, Y represents, for example, a group represented by the following formula (3).

Examples of the modified polyphenylene ether compounds represented by the formula (2) include a modified polyphenylene ether compound in which, among $R_9$ to $R_{16}$, $R_9$, $R_{10}$, $R_{15}$ and $R_{16}$ are methyl groups and the others are hydrogen atoms, a modified polyphenylene ether compound in which, among $R_9$ to $R_{16}$, $R_9$, $R_{10}$, $R_{11}$, $R_{14}$, $R_{15}$ and $R_{16}$ are methyl groups, and the others are hydrogen atoms, and the like.

[Chemical Formula 3]

(3)

In the formula (3), $R_{17}$ and $R_{18}$ each independently represent a hydrogen atom or an alkyl group. Examples of the alkyl group include a methyl group and the like. In addition, examples of the group represented by the formula (3) include a methylene group, a methylmethylene group, a dimethylmethylene group, and the like.

Xs in the formula (1) and the formula (2) are substituents having an unsaturated carbon-carbon double bond as described above. The substituent having an unsaturated carbon-carbon double bond is not particularly limited. Examples of the substituent include substituents represented by the following formula (4) and the like.

[Chemical Formula 4]

(4)

In the formula (4), s represents 0 to 10. In addition, Z represents an arylene group. Also, $R_{19}$ to $R_{21}$ are independent of each other. That is, $R_{19}$ to $R_{21}$ may be the same group or different groups. Moreover, $R_{19}$ to $R_{21}$ represent a hydrogen atom or an alkyl group.

In the formula (4), when s is 0, it represents a compound in which Z is directly bonded to a terminal of a polyphenylene ether.

This arylene group is not particularly limited. Specific examples include a monocyclic aromatic group such as a phenylene group, a polycyclic aromatic group in which the aromatic is not monocyclic but polycyclic aromatic such as a naphthalene ring, and the like. Also, the arylene group also includes derivatives in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

More specific examples of the substituent include vinylbenzyl groups (ethenylbenzyl groups) such as a p-ethenylbenzyl group and a m-ethenylbenzyl group, a vinylphenyl group, an acrylate group, a methacrylate group, and the like.

Preferable specific examples of the substituents represented by the above formula (4) include a functional group including a vinylbenzyl group. Specific examples include at least one substituent selected from the following formulae (5) and (6) and the like.

[Chemical Formula 5]

(5)

[Chemical Formula 6]

(6)

Examples of the substituent having an unsaturated carbon-carbon double bond include substituents represented by the following formula (7) and the like, in addition to the substituents represented by the above formula (4). Moreover, specific examples of the substituent include an acrylate group, a methacrylate group, and the like.

[Chemical Formula 7]

(7)

In the formula (7), $R_{22}$ represents a hydrogen atom or an alkyl group. The alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

Examples of the polyphenylene ether chain in the modified polyphenylene ether compound include repeating units represented by the following formula (8), in addition to the repeating units contained in the modified polyphenylene ether compounds represented by the above formulas (1) and (2).

[Chemical Formula 8]

(8)

In the formula (8), p represents 1 to 50, corresponds to the total value of m and n in the formula (1) or formula (2), and is preferably 1 to 30. Also, $R_{23}$ to $R_{26}$ are independent of each other. That is, $R_{23}$ to $R_{26}$ may be the same group or different groups. Further, $R_{23}$ to $R_{26}$ represent a hydrogen atom, an alkyl group, an alkenyl group, an alkynyl group, a formyl group, an alkylcarbonyl group, an alkenylcarbonyl group, or an alkynylcarbonyl group. Among them, a hydrogen atom and an alkyl group are preferable. In addition, the groups listed in $R_{23}$ to $R_{26}$ are specifically the same as the groups listed in $R_1$ to $R_8$.

The weight average molecular weight (Mw) of the modified polyphenylene ether compound used in the present embodiment is not particularly limited. Specifically, it is preferably 500 to 5000, more preferably 800 to 4000, and further preferably 1000 to 3000. Here, the weight average molecular weight may be a value measured by a general molecular weight measuring method, and specifically includes a value measured using gel permeation chromatography (GPC) and the like.

The modified polyphenylene ether compound having a weight average molecular weight in such ranges has excellent low dielectric properties of the polyphenylene ether, and a cured product not only has more excellent heat resistance but also has excellent moldability. This is considered due to the following. A normal polyphenylene ether having a weight average molecular weight in such ranges has a relatively low molecular weight, thus the heat resistance of a cured product tends to decrease. In this respect, the modified polyphenylene ether compound has an unsaturated double bond at a terminal, and thus it is considered that a cured product having sufficiently high heat resistance is obtained. Further, the modified polyphenylene ether compound having a weight average molecular weight in such ranges has a relatively low molecular weight, and thus it is considered that the cured product also has excellent moldability. Therefore, it is considered to obtain such a modified polyphenylene ether compound having not only more excellent heat resistance of a cured product but also excellent moldability.

In the modified polyphenylene ether compound used in the present embodiment, an average number of the substituents at a molecular terminal (the number of terminal functional groups) per one molecule of the modified polyphenylene ether compound is not particularly limited. Specifically, the number of terminal functional groups is preferably 1 to 5, more preferably 1 to 3, and further preferably 1.5 to 3. When the number of terminal functional groups is too small, it tends to be difficult to obtain a cured product having sufficient heat resistance. Moreover, when the number of terminal functional groups is too large, reactivity becomes too high, and for example, storability of a resin composition may deteriorate, or malfunctions such as deterioration of fluidity of the resin composition may occur. That is, when such a modified polyphenylene ether compound is used, due to lack of fluidity or the like, for example, molding defect such as generation of a void during multilayer molding might occur, causing a problem of moldability that it is difficult to obtain a highly reliable wiring board.

The number of terminal functional groups of the modified polyphenylene ether compound is, for example, a numerical value representing an average value of the substituents per one molecule in a whole modified polyphenylene ether compound present in 1 mol of the modified polyphenylene ether compound. The number of terminal functional groups can be determined by, for example, measuring the number of hydroxyl groups remaining in the obtained modified polyphenylene ether compound and calculating a decrease from the number of hydroxyl groups of the polyphenylene ether before modification. The decrease from the number of hydroxyl groups in the polyphenylene ether before modification is the number of terminal functional groups. Then, the number of hydroxyl groups remaining in the modified polyphenylene ether compound can be obtained by adding a quaternary ammonium salt associated with a hydroxyl group (tetraethylammonium hydroxide) to a solution of the modified polyphenylene ether compound, and measuring UV absorbance of the mixed solution.

The intrinsic viscosity of the modified polyphenylene ether compound used in the present embodiment is not particularly limited. Specifically, the intrinsic viscosity is preferably from 0.03 to 0.12 dl/g, more preferably from 0.04 to 0.11 dl/g, and further preferably from 0.06 to 0.095 dl/g. When the intrinsic viscosity is too low, the molecular weight tends to be low, and it tends to be difficult to obtain low dielectric properties such as low permittivity and low dielectric loss tangent. On the other hand, when the intrinsic viscosity is too high, viscosity is high, sufficient fluidity cannot be obtained, and moldability of the cured product tends to decrease. Therefore, when the intrinsic viscosity of the modified polyphenylene ether compound is within the above ranges, excellent heat resistance and moldability of the cured product can be realized.

The intrinsic viscosity referred to herein is an intrinsic viscosity measured in methylene chloride at 25° C., and more specifically, for example, a value obtained by measuring a 0.18 g/45 ml methylene chloride solution (liquid temperature 25° C.) with a viscometer, or the like. Examples of the viscometer include AVS500 Visco System manufactured by SCHOTT Instruments GmbH and the like.

A method for synthesizing the modified polyphenylene ether compound used in the present embodiment is not particularly limited as long as the method can synthesize a modified polyphenylene ether compound terminally modified with a substituent having an unsaturated carbon-carbon double bond. Specific examples include a method of reacting a compound in which a substituent having an unsaturated carbon-carbon double bond and a halogen atom are bonded, with polyphenylene ether, and the like.

Examples of the compound in which a substituent having an unsaturated carbon-carbon double bond and a halogen atom are bonded include compounds in which the substituent represented by any one of the above formulas (4) to (7) and a halogen atom are bonded, and the like. Specific examples of the halogen atom include a chlorine atom, a bromine atom, an iodine atom, and a fluorine atom, and among them, a chlorine atom is preferable. Specific examples of the compound in which a substituent having an unsaturated carbon-carbon double bond and a halogen atom are bonded include p-chloromethylstyrene, m-chloromethylstyrene, and the like.

The polyphenylene ether as a raw material is not particularly limited as long as it can finally synthesize a predetermined modified polyphenylene ether compound. Specific examples include a polyphenylene ether composed of 2,6-dimethylphenol and at least one of bifunctional phenol and trifunctional phenol, one containing a polyphenylene ether such as poly(2,6-dimethyl-1,4-phenylene oxide) as a main component, and the like. Also, the bifunctional phenol refers to a phenolic compound having two phenolic hydroxyl groups in a molecule, and examples thereof include tetramethyl bisphenol A and the like. Moreover, the trifunctional phenol refers to a phenolic compound having three phenolic hydroxyl groups in a molecule.

Examples of the method for synthesizing the modified polyphenylene ether compound include the methods described above. Specifically, the polyphenylene ether as described above and the compound in which a substituent having an unsaturated carbon-carbon double bond and a halogen atom are bonded are dissolved in a solvent and stirred. This allows the polyphenylene ether to react with the compound in which a substituent having an unsaturated carbon-carbon double bond and a halogen atom are bonded, to obtain a modified polyphenylene ether compound used in the present embodiment.

The reaction is preferably carried out in the presence of an alkali metal hydroxide. It is considered that this reaction thus proceeds suitably. This is considered because the alkali metal hydroxide functions as a dehydrohalogenating agent, specifically, a dehydrochlorinating agent. That is, it is considered that the alkali metal hydroxide desorbs a hydrogen halide from a phenol group of the polyphenylene ether, the compound in which a substituent having an unsaturated carbon-carbon double bond and a halogen atom are bonded, whereby the substituent having an unsaturated carbon-carbon double bond is bonded to an oxygen atom of the phenol group instead of a hydrogen atom of the phenol group of the polyphenylene ether.

The alkali metal hydroxide is not particularly limited as long as it can function as a dehalogenating agent, and examples thereof include sodium hydroxide and the like. Moreover, the alkali metal hydroxide is normally used in an aqueous solution state, and specifically, it is used as an aqueous sodium hydroxide solution.

Reaction conditions such as reaction time and reaction temperature vary depending on the compound in which a substituent having an unsaturated carbon-carbon double bond and a halogen atom are bonded and the like, and are not particularly limited as long as the above reaction proceeds suitably. Specifically, the reaction temperature is preferably room temperature to 100° C., and more preferably 30° C. to 100° C. Also, the reaction time is preferably 0.5 to 20 hours, and more preferably 0.5 to 10 hours.

The solvent used during the reaction is not particularly limited as long as it can dissolve the polyphenylene ether and the compound in which a substituent having an unsaturated carbon-carbon double bond and a halogen atom are bonded, and does not inhibit a reaction of the polyphenylene ether and the compound in which a substituent having an unsaturated carbon-carbon double bond and a halogen atom are bonded. Specific examples include toluene and the like.

The above reaction is preferably carried out in a state where not only an alkali metal hydroxide but also a phase transfer catalyst is present. That is, the above reaction is preferably carried out in the presence of an alkali metal hydroxide and a phase transfer catalyst. It is considered that the above reaction thus proceeds more suitably. This is considered due to the following. It is considered due to the fact that a phase transfer catalyst is a catalyst which has a function of taking up an alkali metal hydroxide, is soluble both in a polar solvent phase such as water and also in a nonpolar solvent phase such as an organic solvent, and is capable of migrating between these phases. Specifically, in cases where an aqueous sodium hydroxide solution is used as the alkali metal hydroxide and an organic solvent such as toluene which is incompatible with water is used as the solvent, even if the aqueous sodium hydroxide solution is added dropwise to the solvent subjected to the reaction, it is considered that the solvent and the aqueous sodium hydroxide solution separate and the sodium hydroxide is unlikely to migrate to the solvent. Hence, it is considered that the aqueous sodium hydroxide solution added as the alkali metal hydroxide hardly contributes to promotion of the reaction. On the other hand, when the reaction is carried out in the presence of an alkali metal hydroxide and a phase transfer catalyst, it is considered that the alkali metal hydroxide migrates to the solvent in a state of being taken up by the phase transfer catalyst, and the aqueous sodium hydroxide solution is more likely to contribute to the promotion of the reaction. Therefore, it is considered that when the reaction is carried out in the presence of an alkali metal hydroxide and a phase transfer catalyst, the above reaction proceeds suitably.

The phase transfer catalyst is not particularly limited, and examples thereof include quaternary ammonium salts such as tetra-n-butylammonium bromide, and the like.

The resin composition used in the present embodiment preferably contains the modified polyphenylene ether compound obtained as described above as the modified polyphenylene ether compound.

(Crosslinkable Curing Agent)

The crosslinkable curing agent used in the present embodiment is not particularly limited as long as it has an unsaturated carbon-carbon double bond in a molecule. That is, the crosslinkable curing agent may be any as long as it can form a crosslink in the resin composition by being reacted with the modified polyphenylene ether compound to cure the resin composition. The crosslinkable curing agent is preferably a compound having two or more unsaturated carbon-carbon double bonds in the molecule.

The crosslinkable curing agent used in the present embodiment preferably has a weight average molecular weight of 100 to 5000, more preferably 100 to 4000, and further preferably 100 to 3000. When the weight average molecular weight of the crosslinkable curing agent is too low, the crosslinkable curing agent may easily volatilize from a blended component system of the resin composition. Moreover, when the weight average molecular weight of the crosslinkable curing agent is too high, viscosity of varnish of the resin composition and melt viscosity during heat molding may be too high. Therefore, when the weight average molecular weight of the crosslinkable curing agent is within such ranges, a resin composition more excellent in heat resistance of the cured product is obtained. This is considered to be because a crosslink can be suitably formed by the reaction with the modified polyphenylene ether compound. Here, the weight average molecular weight may be a value measured by a general molecular weight measuring method, and specifically includes a value measured using gel permeation chromatography (GPC) and the like.

In the crosslinkable curing agent used in the present embodiment, an average number of unsaturated carbon-carbon double bonds per one molecule of the crosslinkable curing agent (the number of terminal double bonds) varies according to the weight average molecular weight of the crosslinkable curing agent, but, for example, is preferably from 1 to 20, and more preferably from 2 to 18. When the number of terminal double bonds is too small, it tends to be difficult to obtain a cured product having sufficient heat resistance. Moreover, when the number of terminal double bonds is too large, reactivity becomes too high, and for example, storability of a resin composition may deteriorate, or malfunctions such as deterioration of fluidity of a resin composition may occur.

In more consideration of the weight average molecular weight of the crosslinkable curing agent, when the weight average molecular weight of the crosslinkable curing agent is less than 500 (for example, 100 or more and less than 500), the number of terminal double bonds of the crosslinkable curing agent is preferably 1 to 4. Further, when the weight average molecular weight of the crosslinkable curing agent is 500 or more (for example, 500 or more and 5000 or less), the number of terminal double bonds of the crosslinkable curing agent is preferably 3 to 20. In each case, when the number of terminal double bonds is less than the lower limit of the above ranges, the reactivity of the crosslinkable curing agent decreases to lower the crosslink density of the cured product of the resin composition, and heat resistance and Tg may not be sufficiently improved. On the other hand, when the number of terminal double bonds is greater than the upper limit of the above ranges, the resin composition may be easily gelled.

The number of terminal double bonds referred to herein can be known from a product specification value of the crosslinkable curing agent to be used. Specific examples of the number of terminal double bonds referred to herein include a numerical value representing an average value of the number of double bonds per one molecule of all crosslinkable curing agents present in 1 mol of the crosslinkable curing agent, and the like.

Specific examples of the crosslinkable curing agent used in the present embodiment include styrene, divinylbenzene, acrylate compounds, methacrylate compounds, trialkenyl isocyanurate compounds, polybutadiene compounds, maleimide compounds, and the like. Examples of the acrylate compound include polyfunctional methacrylate compounds having two or more acrylic groups in the molecule, such as tricyclodecane dimethanol diacrylate, and the like. Examples of the methacrylate compound include polyfunctional methacrylate compounds having two or more methacrylic groups in the molecule, such as tricyclodecane dimethanol dimethacrylate (DCP), and the like. Examples of the trialkenyl isocyanurate compound include triallyl isocyanurate (TAIC), and the like. Moreover, examples of the crosslinkable curing agent include vinyl compounds having two or more vinyl groups in the molecule (polyfunctional vinyl compounds) such as the polybutadiene described above, vinyl benzyl compounds such as styrene and divinylbenzene having a vinyl benzyl group in the molecule, and the like. Among them, those having two or more carbon-carbon double bonds in the molecule are preferable. Specific examples include trialkenyl isocyanurate compounds, polyfunctional acrylate compounds, polyfunctional methacrylate compounds, polyfunctional vinyl compounds, divinylbenzene compounds, and the like. When these are used, it is considered that crosslinking is more suitably formed by a curing reaction, and heat resistance of the cured product of the resin composition used in the present embodiment can be further increased. In addition, as the crosslinkable curing agent, the exemplified crosslinkable curing agents may be used alone or in combination of two or more. Moreover, as the crosslinkable curing agent, a compound having two or more unsaturated carbon-carbon double bonds in the molecule and a compound having one unsaturated carbon-carbon double bond in the molecule may be used in combination. Specific examples of the compound having one unsaturated carbon-carbon double bond in the molecule include compounds having one vinyl group in the molecule (monovinyl compounds), and the like.

(Content)

The content of the modified polyphenylene ether compound is preferably 40 parts by mass or more, more preferably from 40 parts by mass to 90 parts by mass, and further preferably from 50 parts by mass to 90 parts by mass, with respect to 100 parts by mass of the total of the modified polyphenylene ether compound and the crosslinkable curing agent. That is, the modified polyphenylene ether compound is preferably 40 parts by mass or more, with respect to the total mass of the modified polyphenylene ether compound and the crosslinkable curing agent. Further, the content of the crosslinkable curing agent is preferably 60 parts by mass or less, more preferably from 10 parts by mass to 60 parts by mass, and further preferably from 10 parts by mass to 50 parts by mass, with respect to 100 parts by mass of the total of the modified polyphenylene ether compound and the crosslinkable curing agent. That is, the content ratio of the modified polyphenylene ether compound and the crosslinkable curing agent is preferably 90:10 to 40:60 and preferably 90:10 to 50:50 by mass ratio. When each content of the modified polyphenylene ether compound and the crosslinkable curing agent is a content that satisfies the above ratio, a resin composition more excellent in heat resistance of the cured product is obtained. This is considered to be because a curing reaction between the modified polyphenylene ether compound and the crosslinkable curing agent proceeds suitably.

(Other Components)

The resin composition according to the present embodiment may contain components (other components) other than the modified polyphenylene ether compound and the crosslinkable curing agent as necessary, as long as the effects of the present invention are not impaired. As other components contained in the resin composition according to the present embodiment, for example, additives such as a silane coupling agent, a flame retardant, an initiator, an antifoaming agent, an antioxidant, a thermal stabilizer, an antistatic agent, an ultraviolet absorber, a dye or pigment, a lubricant, and an inorganic filler may be further contained. Also, the resin composition may contain a thermosetting resin such as an epoxy resin in addition to the modified polyphenylene ether compound and the crosslinkable curing agent.

As described above, the resin composition according to the present embodiment may contain a silane coupling agent. The silane coupling agent is not only contained in the resin composition, but may be contained as a silane coupling agent surface-treated in advance on an inorganic filler contained in the resin composition, or may be contained as a silane coupling agent surface-treated in advance on a fibrous base material. The silane coupling agent will be described later.

As described above, the resin composition according to the present embodiment may contain a flame retardant. By containing a flame retardant, flame retardancy of the cured product of the resin composition can be increased. The flame retardant is not particularly limited. Specifically, in a field where halogenated flame retardants such as brominated flame retardants are used, for example, ethylene dipentabromobenzene, ethylene bistetrabromoimide, decabromodiphenyl oxide, and tetradecabromodiphenoxybenzene having a melting point of 300° C. or more are preferred. By using a halogenated flame retardant, it is considered that desorption of halogen at a high temperature can be suppressed and decrease in heat resistance can be suppressed. In a field where halogen-free is required, examples of the flame retardant include phosphate ester flame retardants, phosphazene flame retardants, bisdiphenylphosphine oxide flame retardants, and phosphinate flame retardants. Specific examples of the phosphate ester flame retardant include a condensed phosphate ester of dixylenyl phosphate. Specific examples of the phosphazene flame retardant include phenoxyphosphazene. Specific examples of the bisdiphenylphosphine oxide flame retardant include xylylene bisdiphenylphosphine oxide. Specific examples of the phosphinate flame retardant include metal phosphinates such as aluminum dialkylphosphinate. As the flame retardant, the exemplified flame retardants may be used alone or in combination of two or more.

As described above, the resin composition according to the present embodiment may contain an initiator (reaction initiator). Even if the polyphenylene ether resin composition is composed of a modified polyphenylene ether compound and a crosslinkable curing agent, the curing reaction can proceed. Moreover, even composed of only a modified polyphenylene ether, the curing reaction can proceed. However, it may be difficult to raise the temperature until curing proceeds depending on the process conditions, so a reaction initiator may be added. The reaction initiator is not particularly limited as long as it can promote the curing reaction between a modified polyphenylene ether and a crosslinkable curing agent. Specific examples include oxidizing agents such as α,α'-bis(t-butylperoxy-m-isopropyl)benzene, 2,5-dimethyl-2,5-di(t-butylperoxy)-3-hexyne, benzoyl oxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a carboxylic acid metal salt or the like can be used in combination as necessary. The curing reaction thus can be further promoted. Among them, α,α'-bis(t-butylperoxy-m-isopropyl)benzene is preferably used. Since α,α'-bis(t-butylperoxy-m-isopropyl)benzene has a relatively high reaction initiation temperature, the promotion of the curing reaction when it does not need to be cured, such as during prepreg drying, can be suppressed, and decrease in storage stability of the polyphenylene ether resin composition can be suppressed. Furthermore, α,α'-bis(t-butylperoxy-m-isopropyl)benzene has low volatility, and therefore does not volatilize during prepreg drying or storage and has good stability. Moreover, the reaction initiators may be used alone or in combination of two or more.

As described above, the resin composition according to the present embodiment may contain a filler such as an inorganic filler. The filler is not particularly limited, and examples thereof include those added in order to increase heat resistance and flame retardance of the cured product of the resin composition, and the like. Moreover, heat resistance, flame retardance and the like can be further increased by containing the filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, calcium carbonate, and the like. Among them, as the filler, silica, mica, and talc are preferable, and spherical silica is more preferable. Further, the fillers may be used alone or in combination of two or more. Moreover, the filler may be used as it is, or one surface-treated with a silane coupling agent may be used. Examples of the silane coupling agent include a silane coupling agent having a functional group such as a vinyl group, a styryl group, a methacrylic group, and an acrylic group in a molecule. Further, when the filler is contained, the content (filler content) is preferably from 30% by mass to 270% by mass, and more preferably from 50% by mass to 250% by mass, with respect to the resin composition.

[Resin Varnish]

The resin composition used in the present embodiment may be prepared into a varnish form and used. For example, when producing a prepreg, it may be prepared into a varnish form and used for the purpose of impregnating a base material (fibrous base material) for forming the prepreg. That is, the resin composition may be prepared into a varnish form (resin varnish) and used. Also, in the resin composition used in the present embodiment, the modified polyphenylene ether compound and the crosslinkable curing agent are dissolved in the resin varnish. Such a varnish-like composition (resin varnish) is prepared, for example, as follows.

First, components that can be dissolved in an organic solvent are charged into the organic solvent and dissolved.

At this time, heating may be performed as necessary. Thereafter, a component that does not dissolve in an organic solvent, which is used as necessary, is added thereto and dispersed using a ball mill, a bead mill, a planetary mixer, a roll mill or the like, until the solution becomes a predetermined dispersed state, thereby preparing a varnish-like composition. The organic solvent used here is not particularly limited as long as it dissolves the modified polyphenylene ether compound and the crosslinkable curing agent and does not inhibit the curing reaction. Specific examples include toluene, methyl ethyl ketone (MEK), and the like.

[Fibrous Base Material]

The fibrous base material used in the present embodiment is quartz glass cloth. Quartz glass cloth is glass cloth made of quartz glass yarn, and glass constituting the glass cloth is quartz glass (Q glass) having a silicon dioxide ($SiO_2$) content of 99% by mass or more. The quartz glass cloth is obtained, for example, by weaving using quartz glass fibers.

The fibrous base material used in the present embodiment may be used as it is, or one surface-treated with a silane coupling agent may be used. Examples of the silane coupling agent include a silane coupling agent having a functional group such as a vinyl group, a styryl group, a methacrylic group, and an acrylic group in a molecule.

Examples of the shape of the fibrous base material include woven fabric, non-woven fabric, roving, a chopped strand mat, and a surfacing mat. Among them, it is preferable to use glass cloth in terms of being excellent in strength and not using a binder. Moreover, the glass cloth is more preferably adjusted for air permeability by being subjected to opening treatment. Examples of the opening treatment include treatment performed by spraying high-pressure water on glass cloth, treatment performed by pressing the yarn continuously at an appropriate pressure with a press roll and compressing it flatly, and the like. The air permeability of the glass cloth is preferably 200 $cm^3/cm^2/sec$ or less, more preferably 3 to 100 $cm^3/cm^2/sec$, and further preferably 3 to 50 $cm^3/cm^2/sec$. When this air permeability is too high, opening of the glass cloth tends to be insufficient. Insufficient opening of the glass cloth causes pinholes during prepreg production, increases the coarseness and minuteness of the yarn to cause skew, and causes unevenness during processing such as drilling. Moreover, when the air permeability is too small, it means that strong opening treatment was performed and problems such as fluff tend to occur in the glass cloth. The air permeability is an air permeability measured with a Frazier type air permeability tester in accordance with JIS R3420 (2013). Further, a fibrous base material with a thickness of, for example, about 0.02 mm to 0.1 mm, can generally be used.

[Silane Coupling Agent]

As described above, the prepreg contains a silane coupling agent having an unsaturated carbon-carbon double bond in a molecule. The method for adding the silane coupling agent is not limited as long as it is contained in the prepreg. As the method for adding the silane coupling agent, for example, when the resin composition is produced, the silane coupling agent may be added by adding an inorganic filler surface-treated in advance with the silane coupling agent, or the silica and the silane coupling agent may be added by an integral blend method. Moreover, when the prepreg is produced, the silane coupling agent may be added to the prepreg by using a fibrous base material surface-treated in advance with the silane coupling agent. Among them, the method of adding an inorganic filler surface-treated in advance with the silane coupling agent and the method of using a fibrous base material surface-treated in advance with the silane coupling agent are preferable. That is, an inorganic filler surface-treated in advance with a silane coupling agent is preferable as the inorganic filler, and a fibrous base material surface-treated in advance with a silane coupling agent is preferable as the fibrous base material. Moreover, as the method for adding the silane coupling agent, the method of using a fibrous base material surface-treated in advance with the silane coupling agent is more preferable, and a method combining the method of adding an inorganic filler surface-treated in advance with the silane coupling agent and the method of using a fibrous base material surface-treated in advance with the silane coupling agent is further preferable. That is, it is preferred that an inorganic filler surface-treated in advance with a silane coupling agent is used as the inorganic filler, and a fibrous base material surface-treated in advance with a silane coupling agent is used as the fibrous base material.

The silane coupling agent having an unsaturated carbon-carbon double bond in the molecule is not particularly limited as long as it is a silane coupling agent having an unsaturated carbon-carbon double bond in the molecule. Specific examples of the silane coupling agent include a silane coupling agent having at least one functional group selected from the group consisting of a vinyl group, a styryl group, a methacrylic group and an acrylic group, and the like. That is, examples of the silane coupling agent include compounds having at least one of a vinyl group, a styryl group, a methacrylic group, and an acrylic group as a reactive functional group, and further having a hydrolyzable group such as a methoxy group or an ethoxy group, and the like.

Examples of the silane coupling agent include vinyltriethoxysilane, vinyltrimethoxysilane and the like, as those having a vinyl group.

Examples of the silane coupling agent include p-styryltrimethoxysilane, p-styryltriethoxysilane and the like, as those having a styryl group.

Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-methacryloxypropylethyldiethoxysilane and the like, as those having a methacrylic group.

Examples of the silane coupling agent include 3-acryloxypropyitrimethoxysilane, 3-acryloxypropyltriethoxysilane and the like, as those having an acrylic group.

Among the above, the silane coupling agent is preferably a silane coupling agent having at least one of a methacrylic group and an acrylic group in the molecule. That is, the silane coupling agent is preferably a silane coupling agent having a methacrylic group or a silane coupling agent having an acrylic group. When these silane coupling agents are used, heat resistance of the obtained prepreg is increased, and for example, sufficiently high heat resistance can be exhibited even under severe conditions of moisture absorption.

The content of the silane coupling agent is 0.01% by mass or more and less than 3% by mass, preferably from 0.01% by mass to 2.51% by mass, and more preferably from 0.03% by mass to 1% by mass, with respect to the prepreg. When this content is too small, the effect of adding the silane coupling agent cannot be sufficiently exhibited, and heat resistance and the like tend to decrease. Moreover, when the content is too large, the dielectric loss tangent of a cured product of the prepreg tends to decrease, and low dielectric properties tend to decrease. Therefore, when the content of the silane coupling agent is within the above ranges, the low dielectric properties enhanced by using the quartz glass cloth can be maintained, and further, decrease in heat resistance can be sufficiently suppressed. In addition, the content of this silane coupling agent is the whole amount of the silane coupling agent contained in the prepreg. That is, it is a content based on the total mass of the silane coupling agent added to the resin composition (the silane coupling agent added by an integral blend method), the silane coupling agent surface-treated on the inorganic filler added to the resin composition, the silane coupling agent surface-treated on the fibrous base material provided in the prepreg, and the like.

[Dielectric Properties of Prepreg]

A cured product of the prepreg has a dielectric loss tangent of 0.002 or less at 10 GHz. The dielectric loss tangent of the cured product of the prepreg is preferably as small as possible, and is preferably 0. Therefore, the dielectric loss tangent of the prepreg is preferably from 0 to 0.002, more preferably from 0 to 0.0018, and further preferably from 0 to 0.0016. When the dielectric loss tangent of the cured product of the prepreg is within the above ranges, the cured product has excellent low dielectric properties. It is preferable to adjust the composition of the resin composition, for example, the content and the like of the inorganic filler, initiator and the like, so that the dielectric loss tangent of the cured product of the prepreg falls within the above ranges.

[Production Method]

Next, a method for producing the prepreg according to the present embodiment will be described.

The method for producing the prepreg is not particularly limited as long as the prepreg can be produced. Specifically, when producing a prepreg, the resin composition used in the present embodiment described above is often prepared into a varnish form and used as resin varnish as described above.

Examples of the method for producing the prepreg 1 include a method of impregnating the fibrous base material 3 with the resin composition 2, for example, the resin composition 2 prepared in a varnish form, and then drying it.

The resin composition 2 is impregnated into the fibrous base material 3 by dipping and coating or the like. If necessary, the impregnation can be repeated several times. At this time, it is also possible to finally adjust to a desired composition and impregnation amount by repeating impregnation using a plurality of resin compositions having different compositions and concentrations.

The fibrous base material 3 impregnated with resin composition (resin varnish) 2 is heated at desired heating conditions, for example, at 80° C. or more and 180° C. or less for 1 minute or more and 10 minutes or less. By heating, the prepreg 1 before curing (A-stage) or in a semi-cured state (B-stage) is obtained.

<Metal-Clad Laminate>

Figure 2:
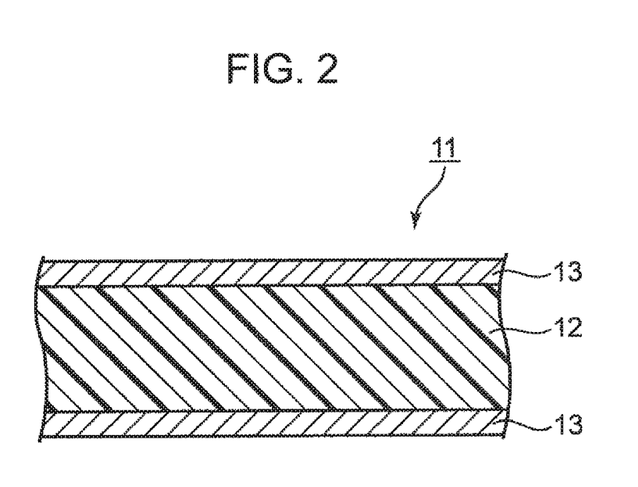
FIG. 2 is a schematic cross-sectional view showing an example of a metal-clad laminate according to an embodiment of the present invention.

FIG. 2 is a schematic cross-sectional view showing an example of a metal-clad laminate 11 according to the embodiment of the present invention.

As shown in FIG. 2, the metal-clad laminate 11 is constituted by an insulating layer 12 containing a cured product of the prepreg 1 shown in FIG. 1, and a metal foil 13 laminated together with the insulating layer 12. That is, the metal-clad laminate 11 has the insulating layer 12 containing the cured product of the prepreg 1 and the metal foil 13 bonded to the insulating layer 12. Also, the insulating layer 12 may be made of the cured product of the prepreg 1.

Examples of a method of preparing the metal-clad laminate 11 using the prepreg 1 include a method of stacking one or more sheets of the prepregs 1, further stacking the metal foil 13 such as a copper foil on both upper and lower surfaces or one surface thereof, and integrally laminating the metal foil 13 and the prepreg 1 by heat press molding, thereby preparing a double-sided metal foil-clad or single-sided metal foil-clad laminate 11. That is, the metal-clad laminate 11 is obtained by laminating the metal foil 13 on the prepreg 1 and heat press molding the laminate. Also, the heat press conditions can be appropriately set depending on the thickness of the metal-clad laminate 11 to be produced, the type of the composition of the prepreg 1, and the like. For example, the temperature can be set from 170° C. to 210° C., the pressure can be set from 3.5 MPa to 4 MPa, and the time can be set from 60 minutes to 150 minutes. Moreover, a metal-clad laminate may be produced, without using a prepreg. Examples include a method of applying a varnish-like resin composition or the like onto a metal foil to form a layer containing the resin composition on the metal foil, and then heating and pressing them, and the like.

Since the prepreg according to the present embodiment is excellent in low dielectric properties and heat resistance, the metal-clad laminate obtained using this prepreg can exhibit excellent low dielectric properties and heat resistance. This metal-clad laminate can produce a wiring board that exhibits excellent low dielectric properties and heat resistance.

Figure 3:
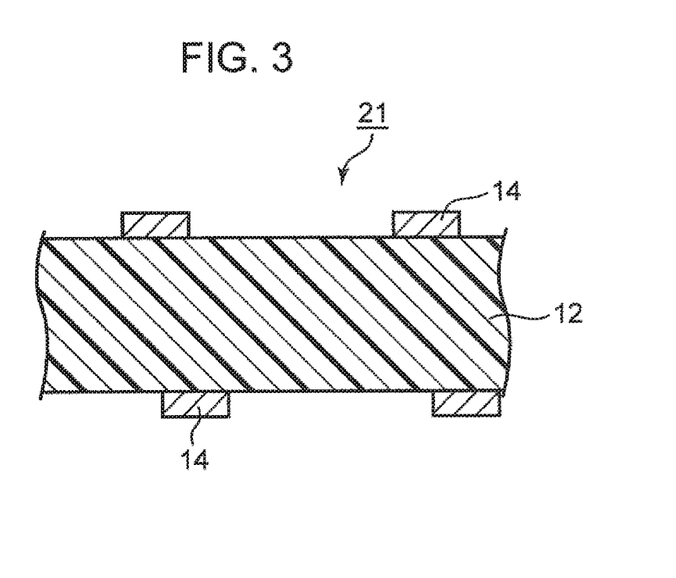
FIG. 3 is a schematic cross-sectional view showing an example of a wiring board according to an embodiment of the present invention.

FIG. 3 is a schematic cross-sectional view showing an example of a wiring board 21 according to the embodiment of the present invention.

As shown in FIG. 3, the wiring board 21 according to the present embodiment is constituted by the insulating layer 12 containing the cured product of the prepreg 1 shown in FIG. 1, and wiring 14 laminated together with the insulating layer 12 and formed by partially removing the metal foil 13. That is, the wiring board 21 has the insulating layer 12 containing the cured product of the prepreg 1 and the wiring 14 bonded to the insulating layer 12. Also, the insulating layer 12 may be made of the cured product of the prepreg 1.

As a method of preparing the wiring board 21 using the prepreg 1, wiring is formed by etching the metal foil 13 on the surface of the metal-clad laminate 11 prepared as described above or the like, whereby the wiring board 21 provided with a wiring as a circuit on the surface of the insulating layer 12 can be obtained. That is, the wiring board 21 is obtained by forming a circuit by partially removing the metal foil 13 on the surface of the metal-clad laminate 11.

Since the prepreg according to the present embodiment is excellent in low dielectric properties and heat resistance, the wiring board obtained using this prepreg can exhibit excellent low dielectric properties and heat resistance.

The present specification discloses various aspects of the technologies as described above, and the main technologies are summarized below.

One aspect of the present invention is a prepreg including a resin composition or a semi-cured product of the resin composition and a fibrous base material, in which the resin composition contains a modified polyphenylene ether compound terminally modified with a substituent having an unsaturated carbon-carbon double bond, and a crosslinkable curing agent having an unsaturated carbon-carbon double bond in a molecule, the fibrous base material is quartz glass cloth, the prepreg contains a silane coupling agent having an unsaturated carbon-carbon double bond in a molecule, in an amount of 0.01% by mass or more and less than 3% by mass with respect to the prepreg, and a cured product of the prepreg has a dielectric loss tangent of 0.002 or less at 10 GHz.

According to such a configuration, a prepreg excellent in low dielectric properties and heat resistance can be provided. First, it is considered that a prepreg obtained by using a quartz glass cloth having a relatively low permittivity as the fibrous base material constituting the prepreg has excellent low dielectric properties of a cured product thereof. However, only by simply using quartz glass cloth as the fibrous base material, there have been cases where low dielectric properties of the cured product are not sufficiently high, or heat resistance of the cured product is not sufficiently high. Therefore, the prepreg not only uses quartz glass cloth as the fibrous base material, but also uses a resin composition containing the modified polyphenylene ether compound and the crosslinkable curing agent, as the resin composition constituting the prepreg. Also, the prepreg contains a predetermined amount of the silane coupling agent in the prepreg. Further, in the prepreg, a state of quartz glass cloth and the like are adjusted so that the dielectric loss tangent of the cured product of the prepreg is within the above range. Thus, a prepreg excellent in low dielectric properties and heat resistance can be obtained.

Moreover, in the prepreg, the crosslinkable curing agent is preferably at least one selected from the group consisting of styrene, divinylbenzene, acrylate compounds, methacrylate compounds, trialkenyl isocyanurate compounds, polybutadiene compounds, and maleimide compounds.

According to such a configuration, a prepreg more excellent in low dielectric properties and heat resistance can be provided.

Further, in the prepreg, the silane coupling agent is preferably a silane coupling agent having at least one functional group selected from the group consisting of a vinyl group, a styryl group, a methacrylic group, and an acrylic group in the molecule.

According to such a configuration, a prepreg more excellent in low dielectric properties and heat resistance can be provided.

Further, in the prepreg, the silane coupling agent is preferably a silane coupling agent having at least one of a methacrylic group and an acrylic group in the molecule.

According to such a configuration, a prepreg more excellent in low dielectric properties and heat resistance can be provided.

Furthermore, in the prepreg, it is preferred that the resin composition further contains an inorganic filler, and the inorganic filler is at least one selected from the group consisting of silica, mica, and talc.

According to such a configuration, a prepreg more excellent in low dielectric properties and heat resistance can be provided.

Also, in the prepreg, the fibrous base material is preferably a base material surface-treated with the silane coupling agent.

According to such a configuration, a prepreg more excellent in low dielectric properties and heat resistance can be provided.

Furthermore, in the prepreg, the substituent in the modified polyphenylene ether compound is preferably at least one selected from the group consisting of a vinylbenzyl group, a vinyl group, an acrylate group, and a methacrylate group.

According to such a configuration, a prepreg more excellent in low dielectric properties and heat resistance can be provided.

Further, another aspect of the present invention is a metal-clad laminate including an insulating layer containing the cured product of the prepreg, and a metal foil.

According to such a configuration, a metal-clad laminate more excellent in low dielectric properties and heat resistance can be provided.

Furthermore, another aspect of the present invention is a wiring board including an insulating layer containing the cured product of the prepreg, and wiring.

According to such a configuration, a wiring board more excellent in low dielectric properties and heat resistance can be provided.

According to the present invention, it is possible to provide a prepreg, a metal-clad laminate, and a wiring board excellent in low dielectric properties and heat resistance.

Hereinafter, the present invention will be further specifically described with reference to examples. However, the scope of the present invention is not limited to these examples.

EXAMPLES

Examples 1 to 23, Comparative Examples 1 to 10

In the examples, components used when preparing a prepreg will be described.

(Polyphenylene Ether: PPE)

Modified PPE-1: A Modified Polyphenylene Ether Obtained by Reacting Polyphenylene Ether and Chloromethylstyrene.

Specifically, these are modified polyphenylene ethers obtained by reacting as follows.

First, a 1 liter three-necked flask equipped with a temperature controller, a stirrer, a cooling apparatus and a dropping funnel was charged with 200 g of a polyphenylene ether (SA90 manufactured by SABIC Innovative Plastics, the number of terminal hydroxyl groups 2, weight average molecular weight Mw 1700), 30 g of a 50:50 (mass ratio) mixture of p-chloromethylstyrene and m-chloromethylstyrene (chloromethylstyrene: CMS manufactured by Tokyo Chemical Industry Co., Ltd.), 1.227 g of tetra-n-butylammonium bromide as a phase transfer catalyst, and 400 g of toluene, and the contents were stirred. Then, stirring was carried out until the polyphenylene ether, the chloromethylstyrene and the tetra-n-butylammonium bromide were dissolved in the toluene. At that time, the contents were gradually heated, and heated until the liquid temperature finally reached 75° C. Then, an aqueous sodium hydroxide solution (20 g of sodium hydroxide/20 g of water) was added dropwise to the solution over a period of 20 minutes as an alkali metal hydroxide. Thereafter, the mixture was further stirred at 75° C. for 4 hours. Next, after neutralizing the contents of the flask with 10% by mass hydrochloric acid, a large amount of methanol was charged thereinto. Thus, a precipitate was formed in the liquid in the flask. That is, the product contained in the reaction solution in the flask was reprecipitated. Then, the precipitate was taken out by filtration, washed three times with a 80:20 (mass ratio) mixed solution of methanol and water, and then dried at 80° C. under reduced pressure for 3 hours.

The resulting solid was analyzed by $^1$H-NMR (400 MHz, CDCl$_3$, TMS). As a result of NMR measurement, a peak attributable to a vinylbenzyl group (ethenylbenzyl group) was confirmed at 5 to 7 ppm. Hence, it was possible to confirm that the resulting solid was a modified polyphenylene ether having a vinylbenzyl group in a molecule as the substituent at the molecular terminal. Specifically, it was possible to confirm that the resulting solid was an ethenylbenzylated polyphenylene ether. The resulting modified polyphenylene ether compound is a modified polyphenylene ether compound represented by the above formula (2), wherein Xs are vinylbenzyl groups (ethenylbenzyl groups), and Y is a dimethylmethylene group (represented by the formula (3), wherein $R_{17}$ and $R_{18}$ in the formula (3) are methyl groups).

Moreover, the number of terminal functional groups of the modified polyphenylene ether was measured as follows.

First, the modified polyphenylene ether was accurately weighed. The weight at that time is defined as X (mg). Then, the weighed modified polyphenylene ether was dissolved in 25 mL of methylene chloride, and 100 μL of 10% by mass solution of tetraethylammonium hydroxide (TEAH) in ethanol (TEAH:ethanol (volume ratio)=15:85) was added to the solution. Thereafter, the absorbance (Abs) at 318 nm was measured using an UV spectrophotometer (UV-1600 manufactured by Shimadzu Corporation). And, from the measurement result, the number of terminal hydroxyl groups of the modified polyphenylene ether was calculated using the following formula.

Amount of Remaining OH (μmol/g)=[(25×Abs)/(ε× OPL×X)]×10$^6$

Here, ε represents an extinction coefficient, which is 4,700 L/mol·cm. Also, OPL is an optical path length of a cell, which is 1 cm.

Then, since the calculated amount of remaining OH (the number of terminal hydroxyl groups) of the modified polyphenylene ether was almost zero, it was found that the hydroxyl groups of the polyphenylene ether before modification were substantially modified. Base on this, it was found that the decrease from the number of terminal hydroxyl groups of the polyphenylene ether before modification was the number of terminal hydroxyl groups of the polyphenylene ether before modification. That is, it was found that the number of terminal hydroxyl groups of the polyphenylene ether before modification was the number of terminal functional groups of the modified polyphenylene ether. Namely, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was determined by measuring a 0.18 g/45 mL solution of the modified polyphenylene ether in methylene chloride (liquid temperature 25° C.) with a viscometer (AVS500 Visco System manufactured by Schott Instruments GmbH). As a result, the intrinsic viscosity (IV) of the modified polyphenylene ether was 0.086 dl/g.

Further, the molecular weight distribution of the modified polyphenylene ether was measured using GPC. Then, the weight average molecular weight (Mw) was calculated from the resulting molecular weight distribution. As a result, Mw was 2300.

Modified PPE-2: A modified polyphenylene ether in which terminal hydroxyl groups of polyphenylene ether have been modified with methacrylic groups (a modified polyphenylene ether compound represented by the above formula (2), wherein Xs are methacrylic groups, and Y is a dimethylmethylene group (represented by the formula (3), wherein $R_{17}$ and $R_{18}$ in the formula (3) are methyl groups), SA9000 manufactured by SABIC Innovative Plastics, weight average molecular weight Mw 2000, the number of terminal functional groups 2)

Unmodified PPE: Polyphenylene ether (SA90 manufactured by SABIC Innovative Plastics, intrinsic viscosity (IV) 0.083 dl/g, the number of terminal hydroxyl groups 2, weight average molecular weight Mw 1700)

(Crosslinkable Curing Agent)

TAIC: Triallyl isocyanurate (TAIC manufactured by Nihon Kasei CO., LTD, molecular weight 249, the number of terminal double bonds 3)

DCP: Tricyclodecane dimethanol dimethacrylate (DCP manufactured by Shin-Nakamura Chemical Co., Ltd., the number of terminal double bonds 2)

(Epoxy Resin)

Epoxy resin: Dicyclopentadiene type epoxy resin (Epiclon HP7200 manufactured by DIC Corporation, the average number of epoxy groups 2.3)

(Reaction Initiator)

Initiator: 1,3-Bis(butylperoxyisopropyl) benzene (Perbutyl P (PBP) manufactured by NOF Corporation)

(Catalyst)

Catalyst: 2-Ethyl-4-methylimidazole (imidazole catalyst, 2E4MZ manufactured by SHIKOKU CHEMICALS CORPORATION)

(Silane Coupling Agent Added to Resin Composition)

Silane coupling agent added to resin composition: 3-Methacryloxypropyltrimethoxysilane (silane coupling agent having a methacrylic group in a molecule, KBM503 manufactured by Shin-Etsu Chemical Co., Ltd.)

(Inorganic Filler)

Silica without surface treatment: Silica particles not surface-treated with a silane coupling agent (SO25R manufactured by Admatechs Company Limited)

Surface-treated silica: Silica particles surface-treated with a silane coupling agent having a vinyl group in a molecule (SC2300-SVJ manufactured by Admatechs Company Limited)

(Fibrous Base Material)

Q Glass: Quartz glass cloth (SQF2116AC-04 manufactured by Shin-Etsu Chemical Co., Ltd., relative permittivity: 3.5, air permeability: 25 cm$^3$/cm$^2$/sec)

L Glass: L Glass cloth (L2116AS760AW manufactured by Asahi Kasei Corporation, relative permittivity: 4.5, air permeability: 20 cm$^3$/cm$^2$/sec)

Of Q glass (quartz glass cloths) or L glass (L glass cloths) above, for those treated with a silane coupling agent, the silane coupling agent is listed in Tables 1 to 3 below. Specifically, the silane coupling agent used is shown below. Here, those that do not list the amount of silane coupling agent are glass cloths which are not surface-treated.

Methacrylic group: Silane coupling agent having a methacrylic group in a molecule Vinyl group: Silane coupling agent having a vinyl group in a molecule Acrylic group: Silane coupling agent having an acrylic group in a molecule Amino group: Silane coupling agent having an amino group in a molecule For the fibrous base materials listed in Table 2 and Table 3, the silane coupling agent having a methacrylic group in the molecule was used.

[Preparation Method]

First, components other than the inorganic filler were added to toluene at blending ratios (parts by mass) shown in Tables 1 to 3 so that the solid content concentration was 60% by mass, and mixed. The mixture was stirred at room temperature for 60 minutes. Thereafter, the inorganic filler was added to the resulting liquid, and the inorganic filler was dispersed by a bead mill. Thus, a varnish-like resin composition (varnish) was obtained.

Next, after impregnating the fibrous base material (the glass cloth) shown in Table 1 with the obtained varnish, prepregs were prepared by heating and drying at 130° C. for about 3 to 8 minutes.

Then, 4 sheets of the resulting prepregs were stacked and heated and pressed under conditions of a temperature of 200° C., 2 hours, and a pressure of 3 MPa, to obtain evaluation substrates (cured products of the prepregs).

The evaluation substrates prepared as described above were evaluated by the following methods.

[Dielectric Loss Tangent (Df)]

The dielectric loss tangent (D) of the evaluation substrates at 10 GHz was measured by a cavity resonator perturbation method. Specifically, the dielectric loss tangent of the evaluation substrates at 10 GHz was measured using a network analyzer (N5230A manufactured by Keysight Technologies LLC).

[Heat Resistance]

Solder heat resistance is measured by a method referring to JIS C 6481. Specifically, two tests are performed. First, the evaluation substrate is subjected to a pressure cooker test (PCT) at a temperature of 121° C. and a relative humidity of 100% RH for 6 hours. The evaluation substrate after the PCT was immersed in a solder bath at 288° C. for 10 seconds. The presence or absence of occurrence of abnormalities such as swelling was visually confirmed on the immersed evaluation substrate. Next, the temperature in the pressure cooker test (PCT) was changed from 121° C. to 133° C., and in the same manner, the evaluation substrate was visually confirmed for the occurrence of abnormalities such as swelling.

As a result, when no abnormality such as swelling was confirmed even in a test at a temperature in the pressure cooker test (PCT) of 133° C., it was evaluated as "Very Good". When an abnormality such as swelling was confirmed in the test at a temperature in the pressure cooker test (PCT) of 133° C. but no abnormality such as swelling was confirmed in the test of 121° C., it was evaluated as "Good". When an abnormality such as swelling was confirmed in the test at a temperature in the pressure cooker test (PCT) of 121° C., it was evaluated as "Poor".

The results in each of the above evaluations are shown in Tables 1 to 3. In Tables 1 to 3, the amount of the silane coupling agent contained in the surface-treated silica (filler) is shown in parentheses as "Amount of silane coupling agent in silane". In addition, the amount of the silane coupling agent contained in the fibrous base material (glass cloth) is shown in parentheses as "Silane coupling agent: Amount in fibrous base material". Moreover, the "Amount of silane coupling agent in prepreg" is a sum of the silane coupling agent contained in the prepreg, and is a total amount of "Silane coupling agent added to resin composition", "Amount of silane coupling agent in silane" and "Silane coupling agent: Amount in fibrous base material".

Also, the amount of the silane coupling agent contained in the surface-treated silica (filler) and the amount of the silane coupling agent contained in the fibrous base material (glass cloth) were specifically calculated by the following methods.

The amount of the silane coupling agent contained in the surface-treated silica (filler) was calculated from the weight loss measurement using a differential thermogravimetric simultaneous analyzer. Specifically, using a differential thermogravimetric simultaneous analyzer (TG/DTA7300 manufactured by Hitachi High-Tech Science Corporation), the temperature was raised from room temperature to 600° C. at 10° C. per minute under a nitrogen flow rate of 200 ml per minute. Then, the amount of weight reduction when kept at 600° C. for 1 hour was defined as the amount of the silane coupling agent contained in the surface-treated silica (filler).

The amount of the silane coupling agent contained in the fibrous base material (glass cloth) is measured by a method in accordance with JIS R3420. More specifically, the amount of weight loss when a sample was dried at 105° C. for 30 minutes and ignited at 625° C. for 2 hours, and then cooled to room temperature in a desiccator containing silica gel as a desiccant was defined as the amount of the silane coupling agent contained in the fibrous base material (glass cloth).

TABLE 1

| | | | Examples | | | | | Comparative Examples | |
|---|---|---|---|---|---|---|---|---|---|
| | | | 1 | 2 | 3 | 4 | 5 | 1 | 2 |
| Resin composition (parts by mass) | PPE | Modified PPE-1 | 20.85 | 20.851 | 20.85 | 20.85 | 20.85 | — | 20.85 |
| | | Modified PPE-2 | — | — | — | — | — | — | — |
| | | Unmodified PPE | — | — | — | — | — | 20.85 | — |
| | Crosslinkable curing agent | TAIC | 9 | 9 | 9 | 9 | 9 | — | 9 |
| | | Epoxy resin | — | — | — | — | — | 9 | — |
| | | Initiator | 0.15 | 0.15 | 0.15 | 0.15 | 0.15 | — | 0.15 |
| | | Catalyst | — | — | — | — | — | 0.15 | — |
| | Silica without surface treatment | | 25 | 25 | — | — | — | 25 | 25 |
| | Surface-treated silica | Sum | — | — | 25 | 25 | 25 | — | — |
| | | Amount of silane coupling agent in silica | — | — | (0.01) | (0.01) | (0.01) | — | — |
| Fibrous base material (parts by mass) | Material | Q Glass | 45 | 45 | 45 | 45 | 45 | 45 | 45 |
| | | L Glass | — | — | — | — | — | — | — |
| | Silane coupling agent: Amount in fibrous base material | Methacrylic group | (0.04) | — | (0.04) | — | — | (0.04) | — |
| | | Vinyl group | — | — | — | — | (0.04) | — | — |
| | | Acrylic group | — | (0.04) | — | (0.04) | — | — | — |
| | | Amino group | — | — | — | — | — | — | — |
| Amount of silane coupling agent in prepeg (parts by mass) | | | 0.04 | 0.04 | 0.05 | 0.05 | 0.05 | 0.04 | 0 |
| Dielectric loss tangent | | | 0.0016 | 0.016 | 0.0016 | 0.016 | 0.0018 | 0.004 | 0.0015 |
| Heat resistance | | | Good | Good | Very Good | Very Good | Good | Poor | Poor |

TABLE 1-continued

| | | | Comparative Examples | | | | | |
|---|---|---|---|---|---|---|---|---|
| | | | 3 | 4 | 5 | 6 | 7 | 8 |
| Resin composition (parts by mass) | PPE | Modified PPE-1 | 20.85 | — | — | 20.85 | 20.85 | — |
| | | Modified PPE-2 | — | 20.85 | — | — | — | 20.85 |
| | | Unmodified PPE | — | — | 20.85 | — | — | — |
| | Crosslinkable curing agent | TAIC | 9 | 9 | — | 9 | 9 | 9 |
| | | Epoxy resin | — | — | 9 | — | — | — |
| | | Initiator | 0.15 | 0.15 | — | 0.15 | 0.15 | 0.15 |
| | | Catalyst | — | — | 0.15 | — | — | — |
| | Silica without surface treatment | | 25 | 25 | — | — | — | — |
| | Surface-treated silica | Sum | — | — | 25 | 25 | 25 | 25 |
| | | Amount of silane coupling agent in silica | — | — | (0.01) | (0.01) | (0.01) | (0.01) |
| Fibrous base material (parts by mass) | Material | Q Glass | — | 45 | 45 | 45 | — | 45 |
| | | L Glass | 45 | — | — | — | 45 | — |
| | Silane coupling agent: Amount in fibrous base material | Methacrylic group | (0.04) | — | (0.04) | — | (0.04) | — |
| | | Vinyl group | — | — | — | — | — | — |
| | | Acrylic group | — | — | — | — | — | — |
| | | Amino group | — | (0.04) | — | — | — | (0.04) |
| Amount of silane coupling agent in prepeg (parts by mass) | | | 0.04 | 0.04 | 0.05 | 0.01 | 0.05 | 0.05 |
| Dielectric loss tangent | | | 0.0024 | 0.0021 | 0.004 | 0.0015 | 0.0024 | 0.0021 |
| Heat resistance | | | Good | Poor | Poor | Poor | Very Good | Good |

TABLE 2

| | | | Examples | | | | | | |
|---|---|---|---|---|---|---|---|---|---|
| | | | 6 | 7 | 8 | 9 | 10 | 11 | 12 |
| Resin composition (parts by mass) | PPE | Modified PPE-1 | 20.85 | 20.85 | 20.85 | 20.85 | 20.85 | 20.85 | — |
| | | Modified PPE-2 | — | — | — | — | — | — | 20.85 |
| | Crosslinkable curing agent | TAIC | 9 | 9 | 9 | 9 | 9 | 9 | 9 |
| | | DCP | — | — | — | — | — | — | — |
| | | Initiator | 0.15 | 0.15 | 0.15 | 0.15 | 0.15 | 0.15 | 0.15 |
| | Silica without surface treatment | | 25 | 25 | 25 | — | — | — | 25 |
| | Surface-treated silica | Sum | — | — | — | 25 | 25 | 25 | — |
| | | Amount of silane coupling agent in silica | — | — | — | (0.01) | (0.01) | (0.01) | — |
| | | Talc | — | — | — | — | — | — | — |
| Fibrous base material (parts by mass) | Q Glass | Sum | 45 | 45 | 45 | 45 | 45 | 45 | 45 |
| | | Amount of silane coupling agent in fibrous base material | (1) | (2) | (2.5) | (1) | (2) | (2.5) | (0.04) |
| Amount of silane coupling agent in prepeg (parts by mass) | | | 1 | 2 | 2.5 | 1.01 | 2.01 | 2.51 | 0.04 |
| Dielectric loss tangent | | | 0.0018 | 0.0019 | 0.002 | 0.0018 | 0.0019 | 0.002 | 0.0017 |
| Heat resistance | | | Very Good | Very Good | Very Good | Very Good | Very Good | Very Good | Good |

TABLE 2-continued

|  |  |  | Examples | | | | | Comparative Examples | |
|---|---|---|---|---|---|---|---|---|---|
|  |  |  | 13 | 14 | 15 | 16 | 17 | 9 | 10 |
| Resin composition (parts by mass) | PPE | Modified PPE-1 | — | — | 20.85 | 28.8 | 10.35 | 20.85 | 20.85 |
|  |  | Modified PPE-2 | 20.85 | 20.85 | — | — | — | — | — |
|  | Cross-linkable curing agent | TAIC | 9 | — | 9 | 12 | 4.5 | 9 | 9 |
|  |  | DCP | — | 9 | — | — | — | — | — |
|  |  | Initiator | 0.15 | 0.15 | 0.15 | 0.2 | 0.15 | 0.15 | 0.15 |
|  |  | Silica without surface treatment | — | — | — | — | — | 25 | — |
|  | Surface-treated silica | Sum Amount of silane coupling agent in silica | 25 (0.01) | 25 (0.01) | 25 (0.01) | 34 (0.01) | 40 (0.01) | — | 25 (0.01) |
|  |  | Talc | — | — | 0.75 | — | — | — | — |
| Fibrous base material (parts by mass) | Q Glass | Sum Amount of silane coupling agent in fibrous base material | 45 (0.04) | 45 (0.04) | 45 (0.04) | 25 (0.02) | 45 (0.04) | 45 (3) | 45 (3) |
| Amount of silane coupling agent in prepeg (parts by mass) | | | 0.05 | 0.05 | 0.05 | 0.03 | 0.05 | 3 | 3.01 |
| Dielectric loss tangent | | | 0.0017 | 0.0019 | 0.0017 | 0.0018 | 0.002 | 0.0021 | 0.0021 |
| Heat resistance | | | Very Good | Good | Good | Good | Good | Very Good | Very Good |

TABLE 3

|  |  |  | Examples | | | | | | | | |
|---|---|---|---|---|---|---|---|---|---|---|---|
|  |  |  | 18 | 19 | 20 | 21 | 22 | 23 | 1 | 6 | 9 |
| Resin composition (parts by mass) | PPE | Modified PPE-1 | 20.85 | 20.85 | 20.85 | 20.85 | 20.85 | 20.85 | 20.85 | 20.85 | 20.85 |
|  | Cross-linkable curing agent | TAIC | 9 | 9 | 9 | 9 | 9 | 9 | 9 | 9 | 9 |
|  |  | Initiator | 0.15 | 0.15 | 0.15 | 0.15 | 0.15 | 0.15 | 0.15 | 0.15 | 0.15 |
|  | Silane coupling agent added to resin composition | | 1 | 1 | 1 | 1 | 1 | — | — | — | — |
|  | Silica without surface treatment | | 25 | 25 | 25 | — | — | — | 25 | 25 | — |
|  | Surface-treated silica | Sum Amount or silane coupling agent in silica | — | — | — | 25 (0.01) | 25 (0.01) | 25 (0.01) | — | — | 25 (0.01) |
| Fibrous base material (parts by mass) | Q Glass | Sum Amount of silane coupling agent in fibrous base material | 45 (—) | 45 (1) | 45 (0.04) | 45 (—) | 45 (1) | 45 (0.03) | 45 (0.04) | 45 (1) | 45 (1) |
| Amount of silane coupling agent in prepeg (parts by mass) | | | 1 | 2 | 1.04 | 1.01 | 2.01 | 0.04 | 0.04 | 1 | 1.01 |
| Dielectric loss tangent | | | 0.0018 | 0.0019 | 0.0018 | 0.0018 | 0.0019 | 0.0016 | 0.0016 | 0.0018 | 0.0018 |
| Heat resistance | | | Good | Very Good | Very Good | Good | Very Good | Very Good | Good | Very Good | Very Good |

From Tables 1 to 3, it was found that, in a prepreg including a resin composition containing the modified polyphenylene ether compound and the crosslinkable curing agent or a semi-cured product thereof and a fibrous base material that is quartz glass cloth, the dielectric loss tangent is low and heat resistance of the cured product is high, in the case where the silane coupling agent is contained in an amount of 0.01% by mass or more and less than 3% by mass with respect to the prepreg (Examples 1 to 23), as compared to the case where the silane coupling agent is not contained (Comparative Examples 1 to 10). Therefore, it can be seen that the prepregs according to Examples 1 to 23 can produce metal-clad laminates and wiring boards excellent in low dielectric properties and heat resistance.

Also, it was found that heat resistance is excellent when using the silane coupling agent having a methacrylic group in the molecule and the silane coupling agent having an acrylic group in the molecule as silane coupling agents for surface treatment of the fibrous base material (Examples 3 and 4) more than when using the silane coupling agent having a vinyl group in the molecule (Example 5).

Moreover, comparing Example 18 and Example 6 in which the amount of the silane coupling agent in the prepreg was the same as 1 part by mass, it was found that heat resistance is higher when the silane coupling agent is contained as the silane coupling agent surface-treated on the fibrous base material than when the silane coupling agent is added to the resin composition by the integral blend method.

Further, comparing Example 21 and Example 9 in which the amount of the silane coupling agent in the prepreg was the same as 1.01 parts by mass, it was found that heat resistance is higher when the silane coupling agent is contained by a combined use of addition by the integral blend method and inclusion by the surface treatment on the inorganic filler than by a combined use of the inclusion by the surface treatment on the inorganic filler and inclusion by the surface treatment on the fibrous base material.

Furthermore, comparing Example 23 and Example 1 in which the amount of the silane coupling agent in the prepreg was the same as 0.04 parts by mass, it was found that heat resistance is higher when the silane coupling agent is contained as the silane coupling agent surface-treated on the fibrous base material than by a combined use of the inclusion by the surface treatment on the inorganic filler and the inclusion by the surface treatment on the fibrous base material.

This application is based on Japanese Patent Application No. 2017-190782 filed on Sep. 29, 2017, the content of which is included in the present application.

In order to describe the present invention, the present invention has been properly and fully described in the preceding through embodiments. However, it should be recognized that these embodiments can be readily modified and/or improved by those skilled in the art. Accordingly, insofar as a modified form or improved form devised by those skilled in the art is not at a level that departs from the scope of rights described in the claims, such a modified form or improved form is construed to be encompassed by this scope of rights.

INDUSTRIAL APPLICABILITY

According to the present invention, a prepreg, a metal-clad laminate, and a wiring board excellent in low dielectric properties and heat resistance are provided.

The invention claimed is:

1. A prepreg comprising
a resin composition or a semi-cured product of the resin composition, and
a quartz glass cloth,
wherein
the resin composition contains a modified polyphenylene ether compound terminally modified with a substituent having an unsaturated carbon-carbon double bond, and a crosslinkable curing agent having an unsaturated carbon-carbon double bond in a molecule,
the substituent in the modified polyphenylene ether compound contains at least one selected from the group consisting of
a vinylbenzyl group and
a methacrylic group,
the crosslinkable curing agent contains at least one selected from the group consisting of polyfunctional methacrylate compounds having two or more methacrylic groups
in the molecule, and
trialkenyl isocyanurate compounds,
a content of the modified polyphenylene ether compound is 50 parts by mass to 90 parts by mass with respect to 100 parts by mass of the total of the modified polyphenylene ether compound and the crosslinkable curing agent,
the prepreg contains a silane coupling agent having at least one functional group selected from the group consisting of
a vinyl group,
a methacrylic group, and
an acrylic group
in a molecule,
a content of the silane coupling agent is from 1% by mass to 2.51% by mass, with respect to the prepreg,
air permeability of the quartz glass cloth is 200 $cm^3/cm^2/sec$ or less, and
a cured product of the prepreg has a dielectric loss tangent of 0.002 or less at 10 GHz.

2. The prepreg according to claim 1, wherein the silane coupling agent contains a silane coupling agent having in the molecule at least one of the methacrylic group and the acrylic group.

3. The prepreg according to claim 1, wherein
the resin composition further contains an inorganic filler, and
the inorganic filler contains at least one selected from the group consisting of silica, mica, and talc.

4. The prepreg according to claim 1, wherein the quartz glass cloth contains a quartz glass cloth surface-treated with the silane coupling agent.

5. A metal-clad laminate comprising an insulating layer containing a cured product of the prepreg according to claim 1, and a metal foil.

6. A wiring board comprising
an insulating layer containing a cured product of the prepreg according to claim 1, and
wiring.

* * * * *